United States Patent [19]

Brugger et al.

[11] Patent Number: 5,459,333
[45] Date of Patent: Oct. 17, 1995

[54] SEMICONDUCTOR PHOTODETECTOR WITH POTENTIAL BARRIER REGIONS

[75] Inventors: Hans Brugger; Diplom-Physiker U. Meiners; Ewald Schlosser, all of Senden, Germany

[73] Assignee: Daimler-Benz Aktiengesellschaft, Stuttgart, Germany

[21] Appl. No.: 289,120

[22] Filed: Aug. 11, 1994

[30] Foreign Application Priority Data

Aug. 11, 1993 [DE] Germany .................. 43 26 754.8

[51] Int. Cl.⁶ .................. H01L 27/14; H01L 31/00
[52] U.S. Cl. .................. 257/21; 257/184; 257/446; 257/465
[58] Field of Search .................. 257/14, 17, 20, 257/21, 24, 184, 186, 187, 461, 465, 446

[56] References Cited

U.S. PATENT DOCUMENTS

| | | | |
|---|---|---|---|
| 3,366,802 | 1/1968 | Hilbiber | 257/461 |
| 4,025,943 | 5/1977 | Chamberlain et al. | 257/446 |
| 4,326,210 | 4/1982 | Aso et al. | 257/461 |
| 4,684,968 | 8/1987 | Ohta et al. | 257/446 |
| 4,791,468 | 12/1988 | Hoeberechts | 257/465 |
| 4,835,587 | 5/1989 | Sato et al. | 257/184 |
| 4,912,063 | 3/1990 | Davis et al. | 437/100 |
| 4,912,064 | 3/1990 | Kong et al. | 437/100 |
| 5,087,576 | 2/1992 | Edmond et al. | 437/100 |

FOREIGN PATENT DOCUMENTS

| | | | |
|---|---|---|---|
| 3629402 | 3/1987 | Germany | 257/14 |
| 3635137 | 4/1987 | Germany | 257/461 |

OTHER PUBLICATIONS

S. Chandrasekhar et al.; High Speed Monolithic P–I–N/HBT and HPT/HBT Photoreceivers Implemented with Simple Phototransistor Structure; Proc. ECOC Conference, 1993, Berlin, Germany.

H. David Law et al.; "Alloy Heterostructure High Speed Avalanche Photodiodes", *Journal of Quantum Electronics*, QE15;, 549 (1979).

Kemmer, J., Two–Dimensional X-Ray Detectors on a Silicon Basis, "Physics In Our Time", vol. 19, 1988, No. 5, pp. 150–158.

Primary Examiner—William Mintel
Assistant Examiner—Minhloan Tran
Attorney, Agent, or Firm—Spencer, Frank & Schneider

[57] ABSTRACT

A semiconductor photodetector has a channel of conductive material which connects two terminal poles and is defined by potential barrier regions and by space-charge regions that can be reduced by means of incident light. The channel is comprised of a conductive layer parallel to the surface and having laterally narrowing barrier regions extending through the layer.

11 Claims, 7 Drawing Sheets

FIG. 12

SEMICONDUCTOR PHOTODETECTOR WITH POTENTIAL BARRIER REGIONS

CROSS REFERENCE TO RELATED APPLICATIONS

This application claims the right of priority with respect to application No. P 43 26 754.8 filed in Germany on Aug. 11, 1993, the disclosure of which is incorporated herein by reference.

BACKGROUND OF THE INVENTION

The invention relates to a semiconductor photodetector. Photodetectors are generally supposed to be as sensitive as possible and useful over a wide dynamic range of incident light intensity. In order to obtain a signal that can be evaluated, even at low light intensity, photosensitive elements are frequently followed by an amplifier arrangement which has a nonlinear amplifier characteristic to accommodate the wide dynamic range.

Photodetectors having internal amplification, for example, in the form of avalanche diodes or phototransistors, are already known.

Avalanche photodiodes for a wide wavelength range are described in, for example, D. Law et al, "Alloy Heterostructure High Speed Avalanche Photodiodes", *Journal of Quantum Electronics,* QE15, 549 (1979). Bipolar, or heterobipolar, phototransistors are described in, for example, S. Chandrasekhar et al: "High Speed Monolithic P-I-N/HBT and HPT/HBT Photoreceivers Implemented With Simple Phototransistor Structures", *Proc. ECOC Conference* 1993, Berlin, Germany. These solutions, however, have numerous drawbacks. Avalanche diodes are very sensitive, but require additional electronic measures to increase the dynamics. In contrast, the bipolar phototransistors are insensitive at low light intensity. The sensitivities of the two detector types are typically in a range between 10 A/W and 1000 A/W.

A field effect transistor arrangement used as a photodetector is known from U.S. Pat. No. 3,366,802. In this arrangement an n-doped zone is built into a p-doped substrate. In this n-doped zone more heavily n-doped source and drain contact regions are again realized. In addition, a gate region can be provided between the source contact and the drain contact. The p-n junctions form space-charge regions that constrict the source-drain connection. During light incidence, the width of the space-charge regions is reduced, and the conductivity of the component is thereby increased.

In U.S. Pat. No. 4,326,210.A, a photosensitive field effect component is described which has a slightly conductive layer on the surface, with at least two gate regions and a source contact surrounded by the gate regions, with which contact a drain contact on the opposite substrate side is associated. A current channel extending perpendicularly to the component surface is pinched off by space-charge regions that form regions at the p-n junctions of the gate. During light incidence, the space-charge regions are reduced, and a current flowing between source and drain is emitted as an electrical signal.

SUMMARY OF THE INVENTION

It is therefore an object of the present invention to provide a semiconductor photodetector which has a simple design, a wide dynamic range and high sensitivity.

It is another object of the present invention to provide a method of producing such detectors.

The above and other objects are accomplished according to one aspect of the invention by the provision of a semiconductor photodetector having a channel of conductive material which connects two terminal poles and is defined by potential barrier regions and by space-charge regions that can be reduced by means of incident light, wherein the channel is comprised of a conductive layer parallel to the surface and having laterally narrowing barrier regions extending through the layer.

According to another aspect of the invention there is provided a method of making the above defined semiconductor photodetector which includes applying a conductive layer to an insulating substrate; and creating potential barrier regions for lateral structuring of the current channel perpendicularly to a layer plane of the conductive layer.

A further embodiment of the method according to the invention for making the above defined semiconductor photodetector includes producing isolation regions or doped regions of another charge carrier type than in subsequently produced conductive layers directly in a substrate wafer through the use of selective implantation techniques, or a focused ion beam; and subsequently realizing the conductive layers by means of an epitaxial overgrowth process.

Another embodiment of the method according to the invention for making the above defined semiconductor photodetector includes producing conductive layers with selective implantation methods by means of ion bombardment, or with a focused ion beam, inside a non-conductive layer.

The photodetector of the invention is designed simply and has a very high sensitivity at low light intensity.

At higher light intensity, a logarithmic relationship exists between the output current and the light intensity, by means of which a higher dynamic range is achieved. Through the use of different semiconductor layer structures, the sensitivity can be set in a wavelength range of approximately 600 nm (visible spectral region) to approximately 2 μm (infrared spectral region). Additionally, the detectors can be integrated in the form of planar arrays.

The invention is further disclosed herein by way of preferred embodiments as described in detail below in conjunction with the accompanying drawings.

DETAILED DESCRIPTION OF THE PREFERRED EMBODIMENTS

Figure 1:
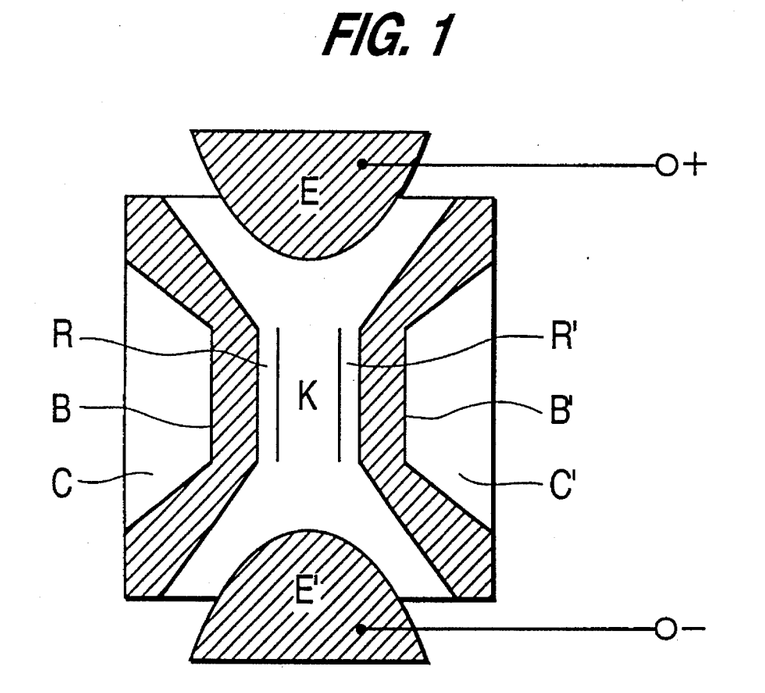
FIG. 1 is a schematic representation of the photodetector according to the invention.

FIG. 1 schematically shows the structure of a photodetector of the invention in a planar embodiment. Located on the semiconductor surface are electrodes E, E' for applying a constant current and barrier regions B, B', which extend completely through a conducting layer, perpendicular to the surface, and define a current channel K in the conducting layer.

Figure 2:
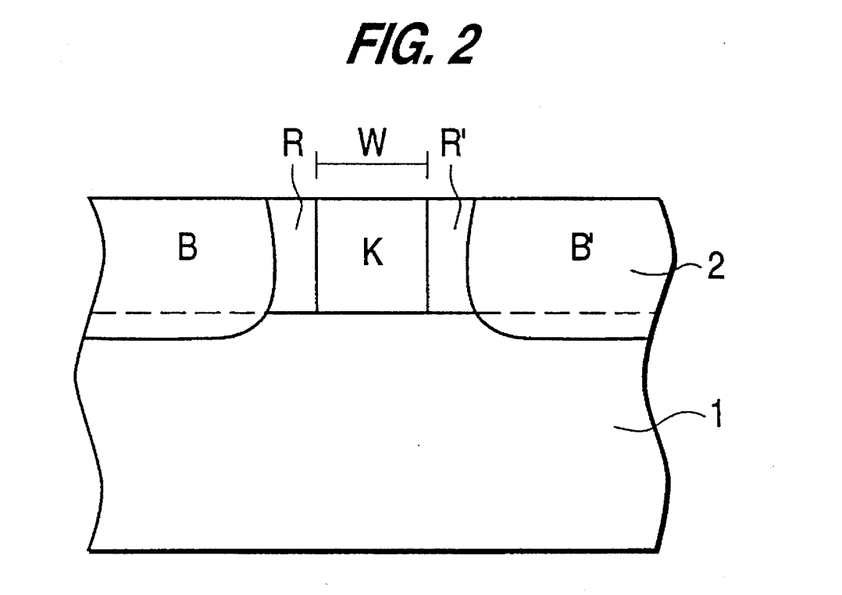
FIG. 2 is a cross-sectional representation perpendicular to the channel region of the photodetector of FIG. 1.

FIG. 2 shows a cross-section through the channel region of an arrangement according to FIG. 1 having, for example, an n-conducting layer between the two barrier regions (B, B'). In the simplest, most advantageous case, the semiconductor layer structure comprises a conductive layer 2, for example epitaxially produced, on a semi-insulating substrate 1, with potential barrier regions produced in conductive layer 2. Instead of the one conductive layer, a series of conductive layers can be provided on substrate 1, in which case it is possible that not all layers are conductive. By means of the lateral structuring of the component, the depth of the light-absorbing space-charge region remains extensively independent of the actual luminous intensity. Another embodiment provides the configuration of the conductive layer as a vertical quantum well that has good photosensitivity, despite the small layer thickness.

Figure 3:
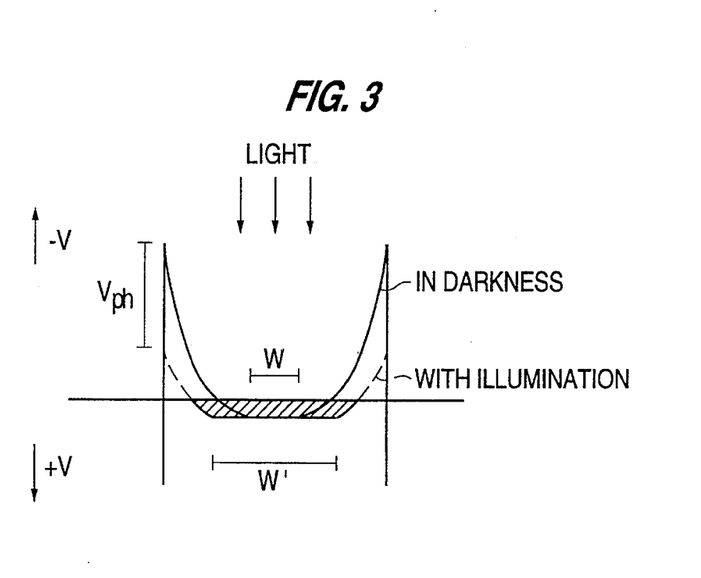
FIG. 3 shows the conduction band-potential curve perpendicular to the channel region of the photodetector of FIG. 1.

FIG. 3 depicts the operation of the photodetector by way of a band diagram for a channel of n-conducting semiconductor material. The potential barrier regions effect band bendings in channel region K that produce space-charge regions R, R' at the channel edge regions, and thus establish an effective channel width w for the current flow between E and E' (FIGS. 1, 2). The space-charge regions are depleted of free carriers. Incident light and absorbed into the channel region and having an energy above the energy band gap generates electron-hole pairs, which reduce the potential barriers or space-charge regions, and thereby lead to an increase in the effective channel width to W'. The increase in the channel current (while the voltage remains the same between E and E', or with saturation of the channel current) is far above the current corresponding to the photoinduced, free carriers. The photodetector can therefore also be regarded as a light-sensitive element having internal amplification, in which the reduction of the potential barrier controls the change in current in the channel. If the reduction of the potential barrier is viewed as the creation of a positive photoelectric voltage Vph, the controlling effect can be described by a transconductance gm of the detector. This transconductance indicates the change in the channel current as a function of this voltage.

The sensitivity of the arrangement can be calculated in a simple manner. The generated photoelectric voltage is obtained by $$Vph=(nkT/e)\ln[(ePabs/h\nu)/IO+1] \quad (1)$$

The increase in the output current caused by this is calculated thus:

$$\Delta IEE'=Vph\, gm \quad (2)$$

Figure 4:
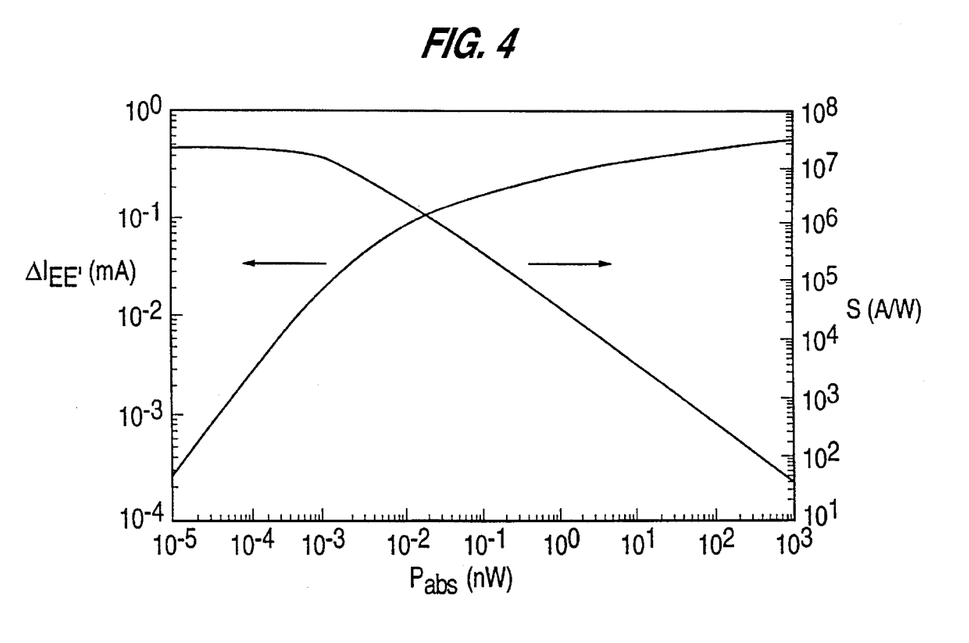
FIG. 4 is a graph which shows the results of a computational estimation of the anticipated photosensitivity and change in the output current of the photodetector of FIG. 1.

The sensitivity of the photodetector results:

$$S=\Delta IEE'/Pabs \quad (3)$$

with
Vph (V)—photoelectric voltage
Pabs (W)—absorbed light
hν(J)—photon energy
IO (A)—reverse saturation current between channel region and barrier region
ΔIEE' (A)—change in the channel current due to light incidence
gm (A/V)—transconductance
S(A/W)—detector sensitivity
n ideality factor of the diode characteristics
k (J/K)—Boltzmann's constant
T (K)—absolute temperature
e (As)—elementary charge The output current calculated in this manner and the sensitivity are represented in FIG. 4. Here the following values were assumed as examples: GaAs material (hν/e= 1.43 V), kT/e=0.025 V, gm=1 mA/V, IO=1 pA, n=1.5. Only an estimate of the anticipated properties is to be performed with these data. It can be seen from FIG. 4 that, at low light intensity, the sensitivity is constant, and values of over $10^6$ A/W (Ampere output current per Watt of incident light intensity) are achieved. At higher light intensities, the sensitivity decreases and the output current is a logarithmic function of the great dynamic range of the detector. This characteristic is essential for the broad dynamic range of the detector. The channel current and/or the voltage drop at the current channel, as well as variables derived therefrom, can be evaluated as a detector signal.

Figure 11:
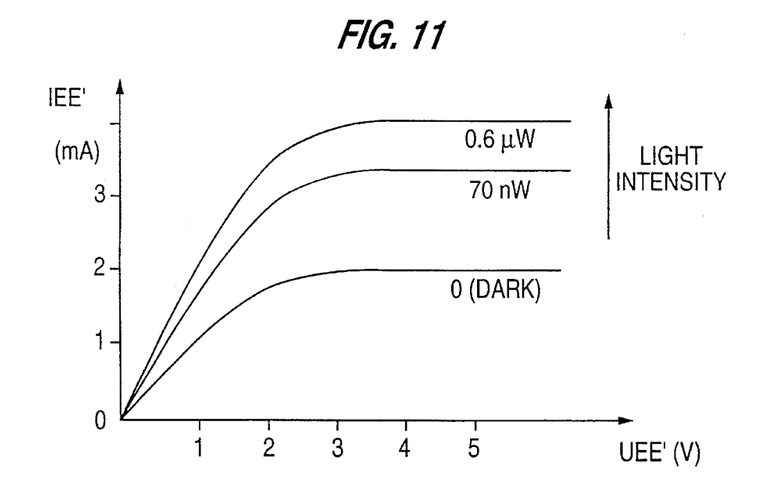
FIG. 11 is a graph which shows current/voltage characteristics of the photodetector at different light outputs.

It is particularly advantageous that the current/voltage characteristics of the detector exhibit a saturating behavior. This is shown in FIG. 11 by way of experimental measurements of an embodiment of the invention. The channel current typically saturates above a voltage of 1 V to 2 V. If the photodetector is operated in the saturation range, the detector signal is no longer a function of the operating voltage between E and E', and, as can be seen in FIG. 11, remains a function only of the incident light intensity. The detector current and/or the voltage dropping at a series resistor can be evaluated as a detector output signal.

The reduction of the potential barrier during light incidence can be considered analogous not only to the generation of a photoelectric voltage, but also to the application of an external voltage between the barrier regions and the channel. A modification of the invention therefore provides two further electrodes C, C' to the side of the channel, by means of which the sensitivity of the detector can be controlled by the application of a voltage, and/or the detector signal can be modulated. With the design of the detector element according to the invention, the light sensitivity is intended to be in no way impaired, and the arrangement can be configured, unchanged, to be planar.

In the following paragraphs it will be shown, by way of an embodiment with experimental measuring results, how the arrangement of the invention can be realized in an advantageous manner. This relates in particular to the selection of suitable material combinations and the method of creating the control regions. Particularly advantageous embodiments are explained with reference to the schematic representations and the measurement curves in FIGS. 5 through 12.

Figure 5:
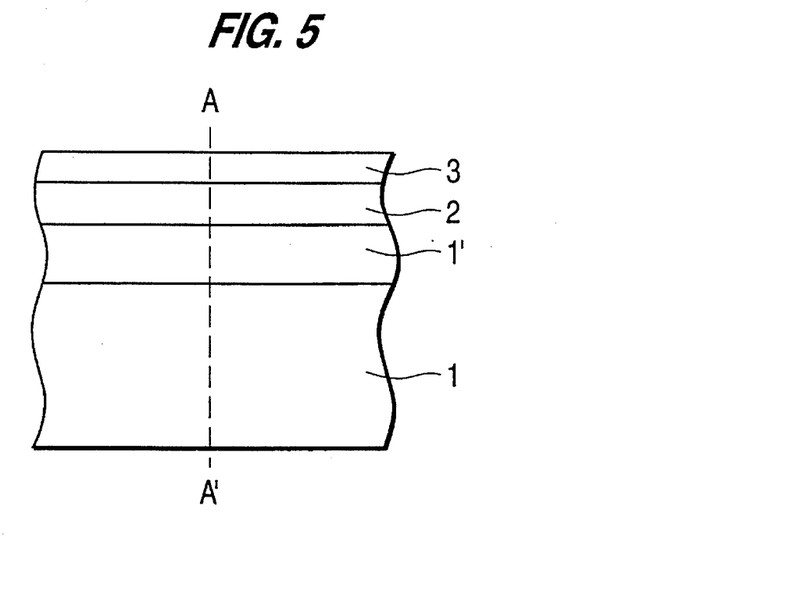
FIG. 5 is a schematic representation of a vertical, epitaxially-produced layer structure for the photodetector according to the invention.

The vertical layer structure of an advantageously configured semiconductor detector on a basis of a III/V material combination is shown in FIG. 5. A semi-insulating gallium arsenide (GaAs) semiconductor layer 1 is used as the substrate. With the aid of an epitaxial crystal-growing method, e.g. molecular beam epitaxy techniques (MBE), an undoped GaAs buffer layer 1' that advantageously contains a short-period AlAs (2 nm)/GaAs (2 nm) superlattice, and usually has a standard thickness of approximately 1 μm, is applied directly to substrate 1. This is followed by a pseudomorphous (i.e. elastically braced) potential well layer 2 of, for example In(20%)Ga(80%)As having a preferred layer thickness in a range between 10 nm and 50 nm where electric strain occurs and a silicon doping concentration in a range of above $10^{18}$ cm$^{-3}$. This results in an effective Hall carrier density of approximately $2\times10^{12}$ cm$^{-2}$. The doping is preferably realized in the form of a thin doping spike within less than 10 nm. A subsequent cover layer 3 is composed of 40 nm-thick GaAs material doped with approximately $3\times10^{17}$ cm$^{-3}$. The approximately 10 nm-thick regions near the surface are very heavily doped, preferably in a range of $3\times10^{18}$ cm$^{-3}$ to $1\times10^{19}$ cm$^{-3}$, in order to realize low-resistance contacts. Correspondingly thicker layers 2 can be realized through the use of low In contents.

Figure 6:
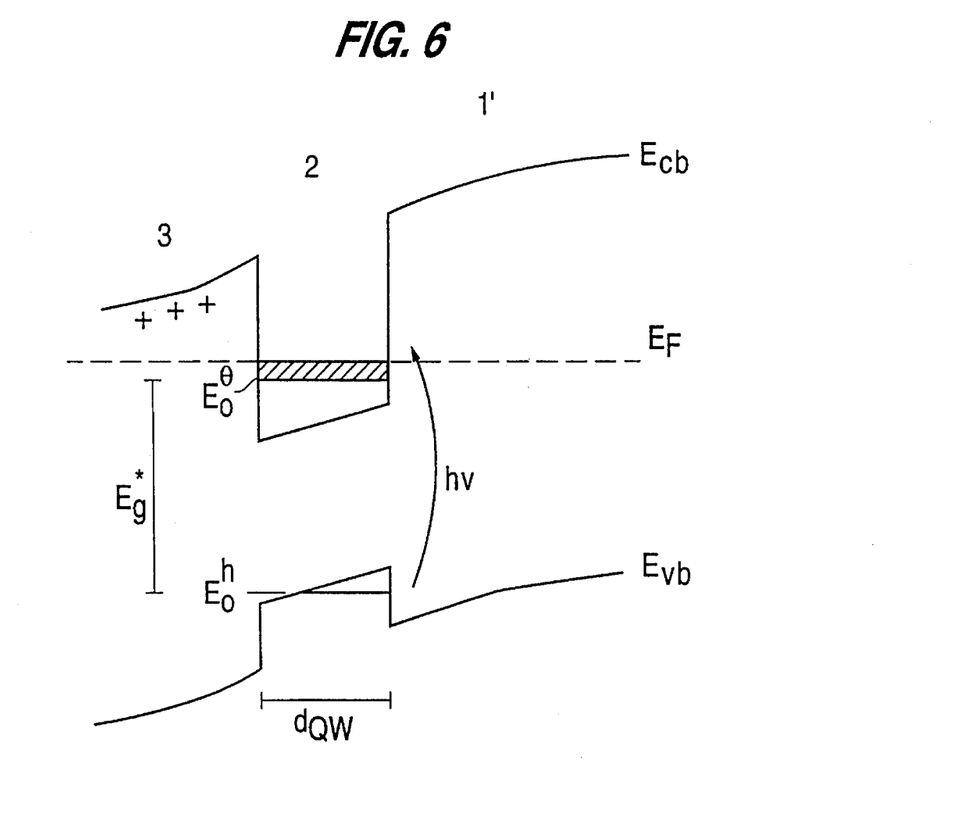
FIG. 6 shows the conduction and valence band-potential curve perpendicular through the vertical semiconductor heterostructure layer sequence along connecting line A—A' of FIG. 5.

Because the band gap energy of InGaAs material is lower than that of GaAs material, a so-called potential well structure (also called quantum well QW) having a width dQW is created, as shown schematically in FIG. 6. By means of this, the electronic conductivity is limited to this QW region of, for example, 20 nm. The doping profile in the cover layer 3 is preferably selected such that, due to the natural surface band bending, no electric parallel conductivity takes place above the potential well. Optical radiation is absorbed for a wavelength $\lambda<\lambda c=hc/(Eg^*+EF-EOe)$, and the effective energy band gap (Eg*) is determined by quantization effects, and set by the spacing between the first electron subband EOe and the first hole subband EOh, as well as the fermi energy ($E_F$–EOe). The cutoff wavelength λc can be set over a wide range due to the material composition and the potential well width dQW. This arrangement permits a high amplification and a selective absorption of the light in the conductive region. Thus, particularly high detector sensitivities are to be expected. Moreover, it is thereby possible to irradiate from the rear side, as is advantageous for upside-down mounted structures.

A further advantageous increase in the sensitivity of the detector is achieved by depositing a plurality of InGaAs potential well layers 2 separated from one another by, for example, 30 nm-thick and $10^{17}$ cm$^{-3}$-doped (Al)GaAs barrier layers.

For the structure of the semiconductor material, which is preferably realized as a vertical series of layers on a substrate, preferred embodiments particularly provide, alternatively or in combination, that the vertical layer structure is composed of a homogeneously-doped semiconductor material the vertical layer structure is composed of a GaAs/AlGaAs heterostructure on a GaAs substrate the vertical layer structure is composed of a pseudomorphous InGaAs/(Al)GaAs heterostructure on a GaAs substrate the vertical layer structure is composed of an InGaAsP/InP heterostructure on an InP substrate the vertical layer structure is composed of a pseudomorphous Si/SiGe heterostructure on an Si substrate the vertical layer system is composed of a pseudomorphous Ge/SiGe heterostructure on an Si substrate or a Ge substrate the vertical layer structure is composed of a GaSb/InAs/AlSb heterostructure on a GaAs substrate or a GaSb substrate the conductive regions are composed of one or a plurality of homogeneously-doped regions the conductive regions are composed of one or a plurality of doped potential well structures the conductive regions are composed of one or a plurality of modulation-doped potential well structures the conductive regions are composed of a combination of one or a plurality of doped or modulation-doped potential well structures the conductive regions lie directly on the surface, or extend up to the surface the conductive regions are covered by a cap layer and are disposed beneath the surface.

Figure 7:
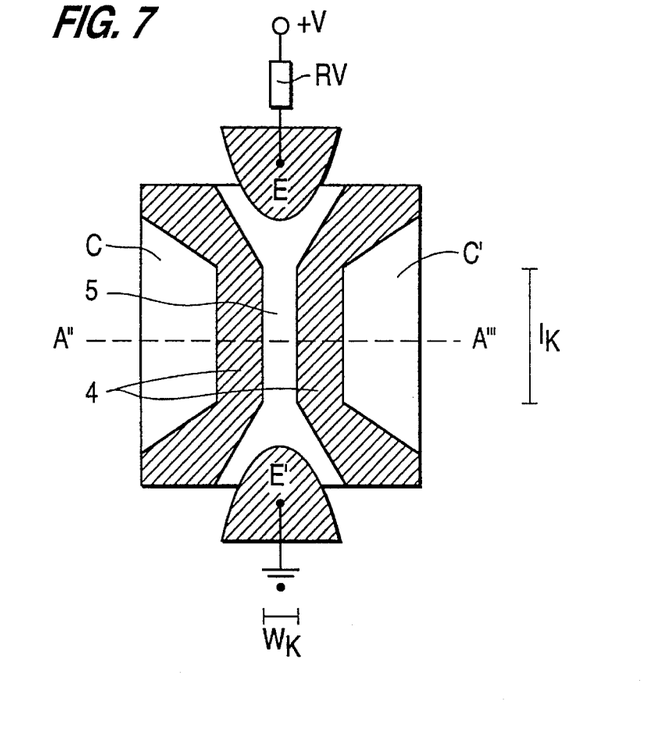
FIG. 7 shows a lateral contact arrangement of an individual photodetector element.

An advantageous lateral layout of the component geometry is illustrated in FIG. 7. A detector element is defined by, for example, a quadrilateral region that is realized by means of mesa etching or an isolation implant in the outer-lying areas. Typical dimensions of the mesa edge length are in a range from 5 μm to 10 μm. A narrow current channel 5 is produced by the creation of barrier regions 4 from the original area connected over the entire surface. The electrical connections are realized by ohmic contact regions E, E', for example, alloyed Ge/Ni/Au metallizations. The barrier geometry is realized such that, for example, trapezoidal barriers (see FIG. 7) form a channel region 5 having a length lk in a range of, for example, 0.1 μm to 5 μm. The length of the channel is preferably greater than its lateral width wk. The nominal channel width wk is typically in a range between 0.1 μm and 3 μm. The thickness of the potential barriers is in a range of 0.1 μm to 2 μm. An electronic circuit element, such as a resistor RV may be arranged in series with the current channel.

Of course, alternatively to the trapezoidal channel shape, other shapes, particularly conically tapering shapes or triangularly tapering barrier areas are possible. The channel shape can be used, among other things, to optimize the detector sensitivity in individual cases.

The barrier regions comprise, for example, highly-insulating areas. The production is effected by way of a selective implantation of, for example, protons or boron ions. For this purpose the semiconductor disk is covered with photoresist and/or a dielectric layer, and window openings are created using photolithographic or electron-beam lithographic methods and subsequent wet-etching or plasma-chemical-etching methods. The photoresist or dielectric layer structured in this way serves as a mask for the implantation step. Alternatively, a focused ion beam can be used which produces the selective implant directly, that is, without mask structuring, in the semiconductor wafer. The damage to the crystal caused during the implantation process creates an insulating effect, and leads to an energy barrier typically in a range of $\geq 0.7$ eV.

Alternatively, oxygen ions can be used that create deep electronic acceptor states in (Al,In)GaAs materials. The activation is effected by means of an annealing step at high temperatures above 600° C. With this method, potential barriers are likewise created, but without damage-induced crystal defects which, depending on the application, can be a significant disadvantage.

Alternatively, potential barriers can be created through the use of doping ions of the charge carrier type other than in the conductive layer, and subsequent annealing; for example, in p-conducting potential regions, carbon, beryllium, magnesium, gallium ions, etc., can be used, and for n-conducting regions, silicon, tin ions, etc, can be used. By means of this, a maximum barrier height is achieved in the region of the band gap energy of >1 eV in (In)GaAs material, and damage-induced crystal defects are likewise prevented.

Alternatively, very shallow or flat implantation profiles can also be used which do not extend up to conductive layer 2. In this instance, depletion zones are created which expand in the vertical direction into the conductive area 2, and thus represent a lateral energy barrier for parallel transport in the conductive layer 2.

Alternatively, vacuum regions or air gaps realized by a selective trench etching can be used as electronic barriers for the generation of the lowest IO values, as they are produced in chemical or plasma-chemical-etching processes.

Alternatively, barriers can be created through doping by means of diffusion methods and local, thermally activated interdiffusion.

Alternatively, the barrier structures can be created in that, prior to the epitaxial growth of the conductive layer 2, isolation structures are created in the substrate wafer through the use of the above-named, selective implantation techniques, and the detector-specific layers 2 and 3 can be created by means of an epitaxial overgrowth process. In the process, depletion zones are formed that create potential barriers in the vertical direction for parallel transport in the conductive layer. Likewise defect-free barrier areas are thereby created in the region of the conductive layer 2.

Alternatively, detector structures can be created in that the conductive areas are created directly using selective implantation techniques, or focused implantation of doping atoms into a semi-insulating substrate. The potential barriers are then formed by the semi-insulating substrate material.

Figure 8:
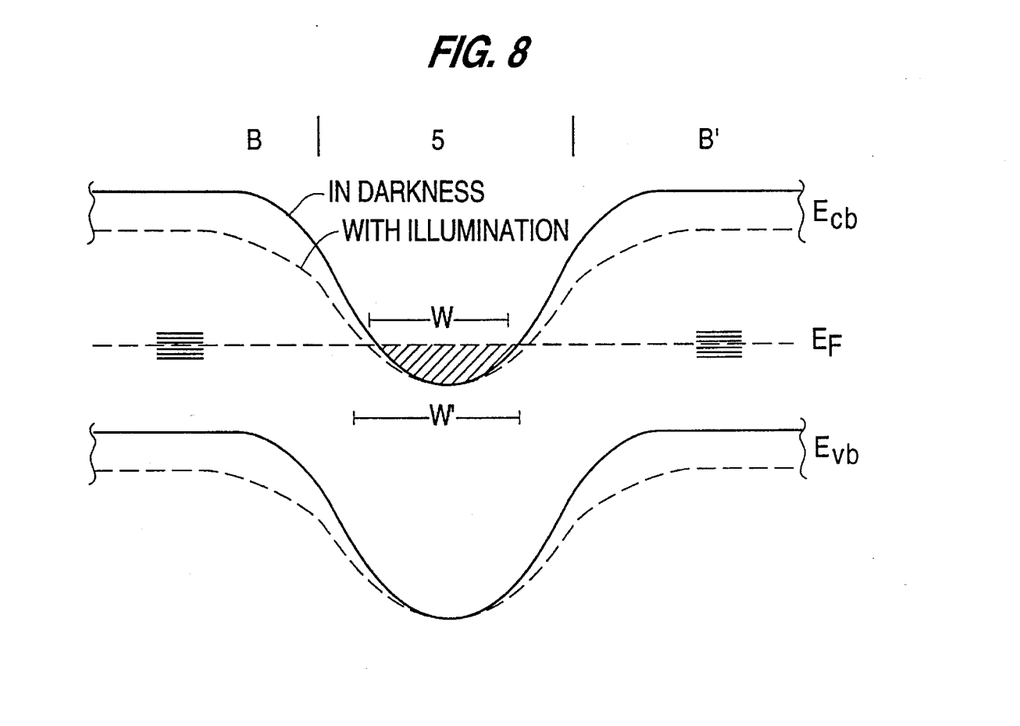
FIG. 8 shows the conduction and valence band-potential course transversely to the channel region, along connecting line A"—A'" in FIG. 7.
Figure 9:
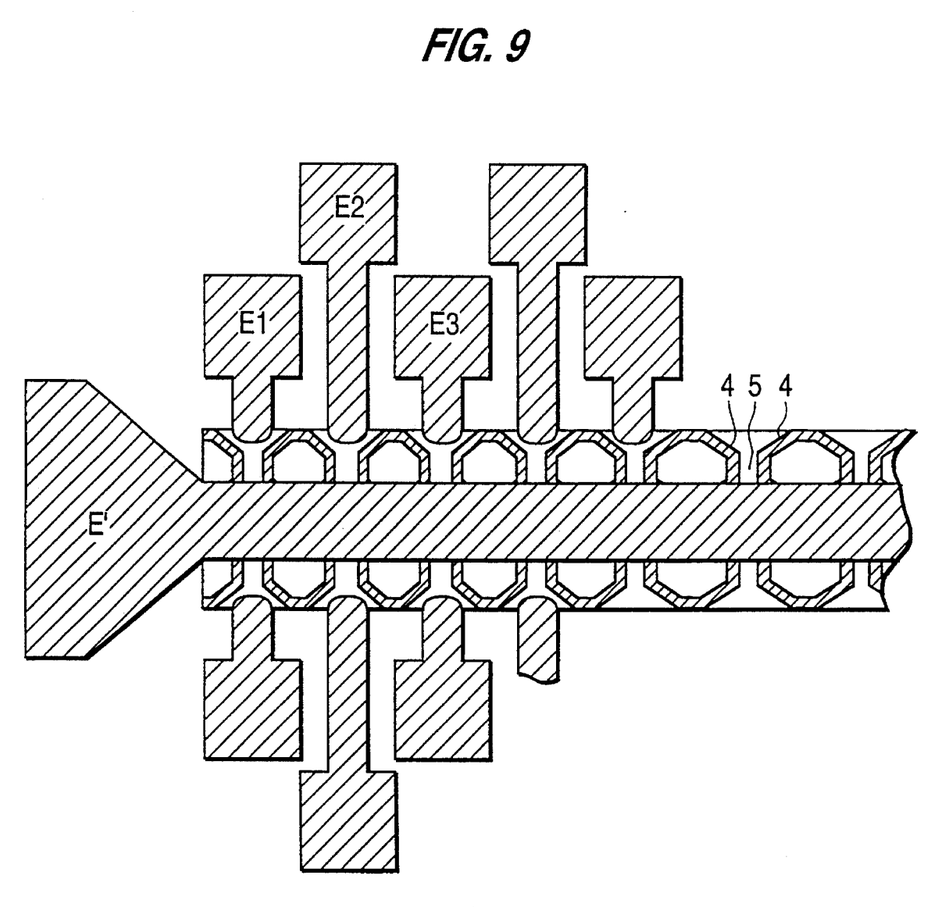
FIG. 9 is a representation of a photodetector in the form of a double-line arrangement (line detector).

FIG. 8 shows the conduction and valence band curve for the n-conducting detector embodied as proposed, namely having a symmetrical potential barrier arrangement on both sides perpendicular to the channel region, along section A"—A'" of FIG. 7. The space-charge regions R, R' are reduced by means of illumination in the channel region 5. This has as a consequence a widening of the effective channel width from w to w', and leads to a very effective increase in the current FIG. 9 is a representation of a line detector having two lines of serially-disposed detector elements. The electric ground connection is produced by a common electrode E'. The selective readout of the individual cells takes place by way of separate electrodes (E1, E2, . . . ). In this way a pixel spacing in the line/row direction can be realized in a range of less than 10μm, even if the lead conductor tracks are all guided away parallel and contiguous to one another in a one-layer wiring technique. Higher pixel densities can be realized through more complex wiring schemes in accordance with the present state of the art.

A matrix-shaped arrangement of individual detectors, e.g. a cascading of the detector lines/rows illustrated in FIG. 9, permits the realization of a planar array detector for camera applications, or for the most precise micropositioning in the sub-μm range. The latter is permitted in that the detector only exhibits a response characteristic in the region of the space-charge regions.

As can be taken from FIGS. 3 and 8, the relative change in current during illumination in comparison to the dark state is also extremely dependent on the ratio of the width of the space-charge regions R, R' to the initial effective channel width w, which can be expressed by an array filling factor.

Figure 10A:
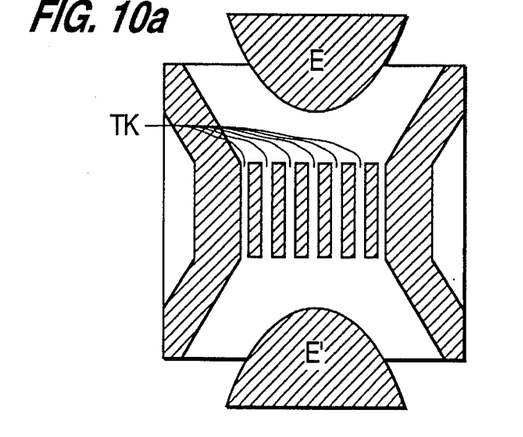
FIGS. 10a to 10c show detector elements having an increased filling factor.
Figure 10B:
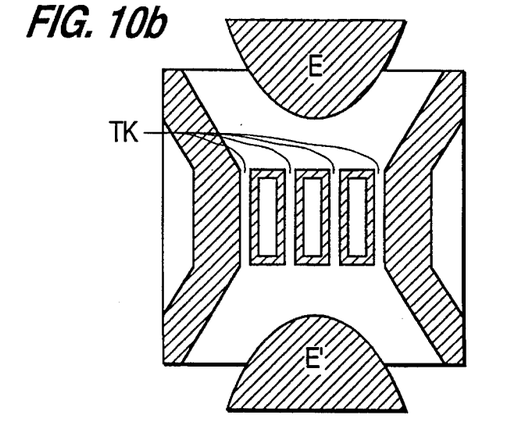
Figure 10C:
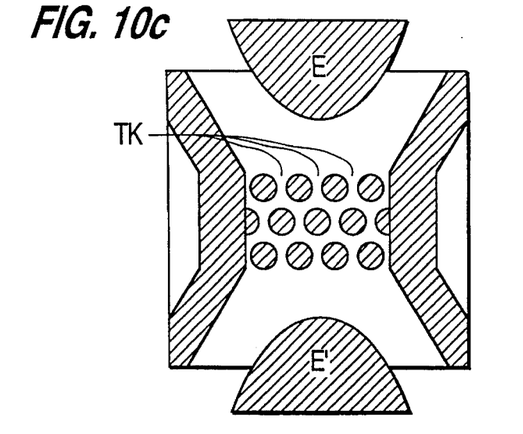

An increase in the sensitivity of a pixel can therefore be achieved in that an individual cell is not only formed by a single photosensitive current channel, but by a series of parallel partial channels TK, which have common electrodes E, E'. Advantageous embodiments are shown in FIGS. 10a to 10c. A plurality of local partial channels TK running electrically parallel to one another are realized by potential barrier regions in the form of rectangles, points, etc., which are surrounded by the partial channels to be isolated in the manner of an island. With this arrangement the filling factor, that is, the photosensitive surface (effective space-charge regions) is multiplied relative to the component area required in circuit technology. If individual cells of this type are cascaded corresponding to the above-described embodiments to realize row/line and planar array detectors, the sensitivity advantage is transferred directly without the total surface requirement being increased.

FIG. 11 shows a measured detector characteristic having the layer structure illustrated in the embodiment by means of a conductive InGaAs absorber layer. The measurement curves were recorded at room temperature with a planar array photodetector having 48 detector elements connected in parallel, each having a mesa surface area of 144 μm$^2$. Each detector element includes only one trapezoidal current channel having a geometric width of wk=0.6 μm, and a length of lk=0.2 μm. The isolation barriers were created by means of a selective implantation with boron ions, and have an isolation resistance of over $10^9$ Ω/sq (>$10^7$ Ωcm). The potential barriers are 0.4 μm wide. The observed cutoff wavelength is at approximately 1.1 μm. The measurement was taken over an output range of less than 1 nW to 1 μW. In the voltage range below approximately 2 V, an ohmic behavior of the channel conductance is observed. With increasing light intensity, the channel resistance is reduced. In the advantageous range above approximately 2 V, the channel current typically exhibits a saturating behavior which is no longer a function of the operating voltage. With increasing light intensity, the channel current rises sensitively.

Figure 12:
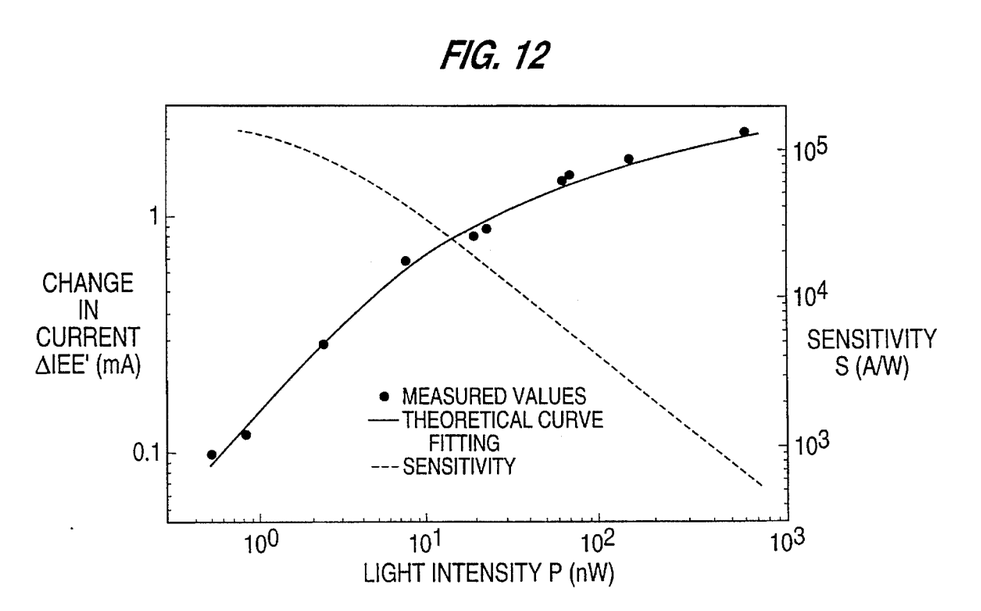
FIG. 12 is a graph which shows the measured light dependent current and sensitivity curve of a planar array photodetector.

The light intensity dependent change in current and the sensitivity curve over the entire measured range are shown in FIG. 12. The experimental values are represented by dots. A theoretical curve fitting according to the above equations (1) through (3) describes the behavior very well. For the lowest light intensity, sensitivities of over $10^5$ A/W were measured. These data are related to the entire illuminated mesa surface area of the array detector of 48×144 μm$^2$. The entries are therefore not corrected relating to the purely photoabsorbing area, which is significantly smaller. The internal sensitivity is therefore clearly even higher.

Particularly through a miniaturization of the structure with respect to an enlargement of the filling factor, and through corresponding reduction of the mesa surface, internal parallel switching of individual elements (see FIG. 10) can be achieved, and clearly higher, extrinsic detector sensitivities can be achieved through optimization of the channel geometry.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. In a semiconductor photodetector including a channel of conductive material which connects two terminal poles and is defined by potential barrier regions and by space-charge regions that can be reduced by means of incident light, the improvement wherein said channel of conductive material is comprised of a conductive layer parallel to a surface of said photodetector and having laterally narrowing barrier regions extending through said conductive layer.

2. A photodetector as defined in claim 1, wherein said photodetector comprises a structure having a planar configuration.

3. A photodetector as defined in claim 2, further including an electronic circuit element coupled to said channel for effecting a saturation of channel current during photodetector operation.

4. A photodetector arrangement comprising one of a line/row and a planar array of photodetectors as defined in claim 2.

5. A photodetector as defined in claim 1, wherein said potential barrier regions form p-n junctions with conductive material in said channel.

6. A photodetector as defined in claim 1, wherein said barrier regions comprise insulating regions.

7. A photodetector as defined in claim 1, further comprising a substrate carrying said photodetector and being transparent for light to be detected.

8. A photodetector as defined in claim 1, wherein said channel comprises a plurality of partial channels surrounding barrier regions isolated in the manner of an island.

9. A photodetector as defined in claim 1, wherein the barrier regions have a trapezoidal shape.

10. A photodetector as defined in claim 1, further comprising control electrodes disposed laterally of said channel to control a sensitivity of said photodetector.

11. A photodetector as defined in claim 1, wherein said channel is formed by at least one potential well layer.

* * * * *